United States Patent [19]

Feng et al.

[11] 4,366,335

[45] Dec. 28, 1982

[54] INDIUM OXIDE/N-SILICON HETEROJUNCTION SOLAR CELLS

[75] Inventors: Tom Feng, Morris Plains; Amal K. Ghosh, New Providence, both of N.J.

[73] Assignee: Exxon Research and Engineering Co., Florham Park, N.J.

[21] Appl. No.: 258,935

[22] Filed: Apr. 30, 1981

Related U.S. Application Data

[63] Continuation-in-part of Ser. No. 222,367, Jan. 5, 1981, abandoned.

[51] Int. Cl.³ ............................................. H01L 31/06
[52] U.S. Cl. ................................... 136/255; 136/258; 136/261; 357/30
[58] Field of Search ................. 136/255, 258 PC, 261; 357/30

[56] References Cited

PUBLICATIONS

J. C. Manifacier et al., "Preparation and Investigation of Sn Doped Si(n)-In₂O₃ Heterojunction", *Proceedings, Int'l Solar Energy Conf.*, Luxembourg, Sep. 1977, pp. 289-298.

T. Feng et al., "Efficient Electron-Beam-Deposited ITO/n-Si Solar Cells", *J. Appl Phys.*, vol. 50, pp. 4972-4974 (1979).

J. C. Manifacier et al., "Efficient Sprayed In₂O₃: Sn n-type Silicon Heterojunction Solar Cell", *Appl. Phys. Lett.*, vol. 31, pp. 459-462 (1977).

E. Y. Yang et al., "Determination of Electron Affinity of In₂O₃ From Its Heterojunction Photovoltaic Properties", *J. Electrochem. Soc.*, vol. 125, pp. 1328-1331 (1978).

*Primary Examiner*—Aaron Weisstuch
*Attorney, Agent, or Firm*—Paul E. Purwin; Robert S. Salzman

[57] ABSTRACT

A high photo-conversion efficiency indium oxide/n-silicon heterojunction solar cell is spray deposited from a solution containing indium trichloride. The solar cell exhibits an Air Mass One solar conversion efficiency in excess of about 10%.

8 Claims, 1 Drawing Figure

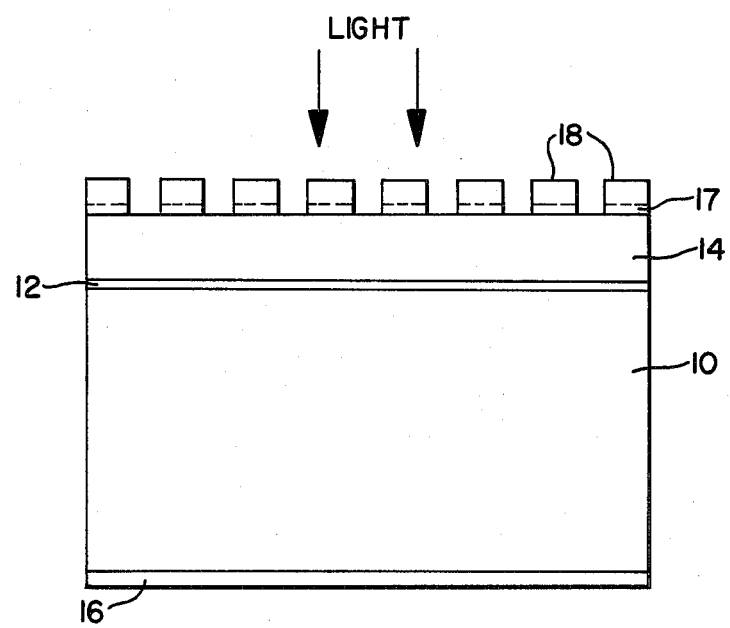

INDIUM OXIDE/N-SILICON HETEROJUNCTION SOLAR CELLS

This application is a continuation-in-part of application Ser. No. 222,367, filed Jan. 5, 1981, now abandoned.

BACKGROUND OF THE INVENTION

The present invention is the result of research performed for the Department of Energy under U.S. Government Contract XJ-0-9077-1.

FIELD OF THE INVENTION

The present invention relates generally to heterojunction solar cells and more particularly to an efficient indium oxide/n-silicon solar cell exhibiting sunlight conversion efficiencies in excess of about 10%. A relatively simple spray hydrolysis is utilized to form the indium oxide semiconductor, deposited onto an oxidized surface of a silicon substrate.

Low cost alternatives to conventional diffused junction silicon solar cells are continually sought to provide viable alternatives to fossil fuel generation of electricity. Low cost processing and fabrication techniques must accompany a threshold solar cell efficiency to be fiscally attractive, for attendant solar cell costs such as land area coverage etc. indicate that a solar cell having an efficiency less than about 10%, irrespective of its intrinsic cost, would not be commercially viable. The present invention is directed to a solar cell satisfying these criteria having both high efficiency and relatively low processing and intrinsic material costs.

The art has well recognized the semiconductor properties of degenerate oxides such as tin oxide, indium tin oxide, and cadmium stanate. Tin oxide has been successfully employed in the fabrication of high efficiency low cost solar cells as illustrated in the applicants' prior invention, U.S. Pat. No. 4,193,821. Indium oxide has been used to form heterojunction solar cells with p-type silicon. Such indium oxide solar cells have previously met with limited success as compared to their tin oxide counterpart principally because they have solar conversion efficiencies less than about 5% and exhibit long-term stability problems. The prior art has taught a construction of indium oxide heterojunction with p-type silicon whereas the present invention is directed to the formation of the heterojunction between indium oxide and n-type silicon having a thin surface layer of silicon oxide. The previous state of the art is best illustrated in a research report (NSF/RANN/SE/AER74-17631/FR/75/3) to the National Science Foundation in which R. L. Anderson et al. noted that indium oxide/p-type silicon ($In_2O_3$/p-Si) solar cells exhibit conversion efficiencies of 3-4% with a maximum conversion efficiency found to be about 4.9%. In addition, they have reported that the $In_2O_3$/n-Si cells that were fabricated by using n-type silicon had poor solar cell characteristics and on the basis of an analysis of the relative electron affinities, they concluded that $In_2O_3$/n-Si cannot be a practical device. In a technical publication in the Japanese Journal of Applied Physics (Vol. 14, No. 6 (1975), p. 915), H. Matsunami et al. have reported that good rectification and photovoltaic effects can only be obtained with $In_2O_3$/p-Si cells but not with $In_2O_3$/n-Si cells. The indium oxide/n-silicon heterojunction solar cells of the present invention, not only far exceed the efficiency of such existing $In_2O_3$/p-Si heterojunction cells, but furthermore, provide relatively simple construction techniques promising a substantial reduction in the overall cost of the solar cells.

SUMMARY OF THE INVENTION

The invention is directed to a high efficiency indium oxide/n-silicon heterojunction solar cell and method for making same. A solution containing indium trichloride ($InCl_3$) is sprayed in air onto the surface of a preheated silicon substrate, where the indium chloride is hydrolyzed to form an indium oxide ($In_2O_3$) film. The deposition technique employs relatively simple, less energy intensive technology as compared to conventional junction diffusion techniques. The resulting heterojunction solar cell exhibits an Air Mass One solar conversion efficiency in excess of about 10%.

BRIEF DESCRIPTION OF THE DRAWING

The singular drawing is a greatly enlarged side-segmented view of a heterojunction solar cell made in accordance with the present invention.

DETAILED DESCRIPTION OF THE INVENTION

Referring to the FIGURE, the solar cell of the present invention comprises an n-type silicon substrate 10 having a relatively thin silicon oxide layer 12. Silicon substrate 10 can be either monocrystalline or polycrystalline in form and having a resistivity generally below about 10 ohm-cm. In a preferred embodiment, silicon substrate 10 comprises a single crystal silicon wafer ranging in thickness of about 5 mils to about 15 mils and having a resistivity ranging from about 0.1 ohm-cm to about 1.0 ohm-cm. To enhance the open-circuit voltage, thus the efficiency, of the cell, a thin $SiO_2$ layer 12 having a thickness in the range of 10 to 30 Angstroms is incorporated. Such a silicon oxide layer can be grown, for example, by heating the silicon in air at an elevated temperature. However, in most instances, a "naturally-grown" $SiO_2$ layer is of sufficient thickness and is preferred. The indium oxide ($In_2O_3$) layer 14, contiguous with the oxidized silicon substrate, forms a heterojunction to the underlying n-type silicon. In addition, layer 14 is characterized as being of a specific thickness and having an index of refraction to act as an anti-reflection coating thus suppressing the reflectivity of the silicon surface. As understood by those skilled in the art, an anti-reflection coating should consist of a film of low refractive index and the optical thickness of the film should be an integer multiple of $\lambda/4$, where $\lambda$ is the wavelength of the incident light. To be highly effective, however, the refractive index of the anti-reflection film should be approximately the square root of the refractive index of the underlying substrate. As employed in the present invention, silicon substrate 10 and indium oxide layer 14 have indices of refraction of about 4 and 2, respectively. To substantially reduce the reflection of solar radiation from the surface of the silicon substrate, the thickness of the indium oxide layer 14 is chosen to result in a blue interference color. Depending on the order of interference, various specific thicknesses of indium oxide film will result in a blue interference color (see for example, J. L. Vossen, "Transparent Conducting Films", in Physics of Thin Films, Vol. 9, Edited by E. Hass, M. H. Francombe, and R. W. Hoffman, Academic Press, N.Y., (1977), p. 18.)

Indium Oxide Layer 14 is further characterized as being semitransparent, permitting a sufficient amount of light energy incident thereupon to pass therethrough and into the silicon. As presently understood, in the formation of the heterojunction between the indium oxide and the oxidized silicon substrate the depletion region or barrier region is contained within the silicon substrate 10. Furthermore, charge carriers generated within the silicon substrate, outside the depletion region, will migrate to the field region to effectively contribute to the current generation of the solar cell. It is accordingly required that a substantial amount of light pass through the indium oxide layer 14 and be absorbed in the silicon substrate. Thereby, according to one aspect of the present invention, indium oxide layer 14 has a thickness less than about 5000 Angstroms. In addition, because suppression of the surface reflection becomes more selective with wavelength as the interference order increases, in a preferred embodiment the thickness of the indium oxide film 14 is chosen to correspond to a first order interference, that is, between approximately 600 and 1400 Angstroms.

Ohmic electrodes 16 and 18 comprise highly conductive materials, generally metals. Ohmic electrode 18, which is illustrated in part by the FIGURE's side view, comprises a grid configuration permitting a substantial amount of incident light to pass between the grid configuration. As recognized by those of the art, the grid configuration is utilized where the underlying semiconductor material is of insufficient electrical conductivity to support the current generated by the solar cell. The geometric configuration of grid 18 may comprise any of the number of alternatives which attempt to optimize surface coverage and minimize series resistance of the solar cell. Parameters leading to the optimization of the grid configuration include the current generation characteristics of the heterojunction, resistivity of electrode material utilized to configure grid 18, and the electroresistivity of indium oxide layer 14. In a preferred embodiment, an adherence layer 17 bonds the grid material 18 to the oxide. A thin film of titanium has been demonstrated to serve as an effective bonding or adherence layer for conductive grids such as silver for example.

As discussed heretofore, the present solar cell technology incurs substantial expenditures in the processing of the solar cell. According to one aspect of the present invention, a relatively simple means for producing the indium oxide/n-silicon solar cell promises substantial cost reduction in the fabrication of efficient, inexpensive solar cells. The process comprises heating the silicon substrate in air at a temperature ranging from about 350° C. to about 450° C. Upon reaching the required temperature, the heated substrate is contacted with an atomized liquid solution containing indium trichloride (InCl$_3$) which will hydrolyze upon contact with the heated substrate and, in the presence of air, to form the indium oxide layer of the present invention. Generally described, the atomizing liquid solution comprises anhydrous indium trichloride, water, and an organic ester, and/or an alcohol having boiling points of about less than 250° C. Examples of alcohols and organic esters suitable for use in the present invention include: methyl alcohol, ethyl alcohol, ethyl acetate, butyl acetate, amyl acetate, and propyl acetate. Anhydrous indium trichloride is not readily soluble in alcohol or organic ester and requires first dissolution in water, followed by the addition of the remainder of the solvent. The amount of water employed is generally sufficient to dissolve the indium trichloride. The remainder of the solvent may comprise either an ester or an alcohol. However, it is particularly preferred that solutions having an about one to one volume ratio of an ester and alcohol be employed. A solution concentration of indium trichloride between 0.05 molar to 5 molar is preferred.

In atomizing the liquid solution, any well-known atomizing device may be used. For example, electrostatic, pneumatic, or vibrational atomizing may be used to provide a spray or mist of the liquid solution of indium trichloride. It is particularly preferred in the practice of the present invention to use a pneumatic spraying device, in which the gas used to atomize the liquid solution is air. It should be appreciated however, that other carrier gases, including oxygen, may be employed.

As is well-known, spray guns typically subdivide liquid solution into droplets having diameters generally in the range of 100 to 1,000 microns, whereas misting devices generate or subdivide liquid solutions into droplets having diameters in the range of 10 to 100 microns. While the size of the droplets produced during the atmoziation of the indium trichloride solution has not been demonstrated to be critical, it is desirable that the droplets be generally less than about 1,000 microns in diameter. It is also generally desirable that the spray or mist be uniform across at least the area to be coated. Conventional liquid spray devices produce such an atomized stream of solution.

The contacting of the heated silicon substrate with the atomized solution is continued for a time sufficient to form the requisite thickness of an indium oxide layer. Although numerous thickness measuring techniques are known in the art, the deposition technique taught in the present invention is of particular advantage inasmuch as a visual observance of the interference color of the film during deposition provides a convenient and relatively accurate means for monitoring the thickness of the depositing indium oxide layer. Accordingly, the deposition continues until an interference color of deep blue is observed. A sufficient and preferred thickness of indium oxide ranges from about 600 Å to about 1400 Å, although thicker layers corresponding to higher order interference are also operable in the present invention.

The silicon substrate is continually heated throughout the deposition of the indium oxide layer. It is to be recognized that the temperature range as recited herein represents a temperature monitored at the substrate surface prior to spraying by means of a surface probe such as a digital temperature indicator, Model 64-06-02 sold by Watlow Corp., Winona, Minn. Reference is made to the substrate surface temperature herein and there can be significant difference in the temperature of the substrate surface and the temperature of the furnace employed for heating the substrate. For example, it has been found that the surface temperature of the silicon substrate heated by a graphite vacuum chuck only reached 405° C. while the temperature inside the heating chuck was monitored at 430° C. Although it is not necessary to monitor the substrate surface temperature once the relationship between the surface temperature and the furnace temperature is established, nonetheless reference to temperature of substrate surface is made herein to assist one skilled in the art in the practice of the present invention.

The time required for the deposition of the indium oxide layer is generally less than 2 minutes and is typically of the order of 40 seconds. As should be readily appreciated, the time required for deposition of an adequate layer of indium oxide will depend upon the concentration of the solution, the flow rate of the solution and the temperature of the substrate. According to one aspect of the present invention, upon completion of depositing the indium oxide layer the silicon substrate is removed from the heat source to rapidly lower the temperature of the device.

After deposition of the indium oxide, the coated silicon substrate was provided with appropriate electrodes. For example, back contact metallization is accomplished by standard techniques such as vacuum evaporation of 1000 Angstroms of titanium followed by 5000 Angstroms or more of silver to provide a good ohmic contact to silicon. Front contact metalization described heretofore, is also accomplished by standard techniques, except that the titanium and silver are evaporated through a suitable mask with appropriate grid patterns.

The solar cells constructed in conformity with the present invention exhibit a solar Air Mass One conversion efficiency greater than about 10%.

To further assist one skilled in the art in the practice of the present invention, the following example details a specific embodiment of the invention.

EXAMPLE 1

Following the general procedures outlined hereinabove, a series of indium oxide/n-silicon solar cells were fabricated and the sunlight power conversion efficiencies were measured.

Single crystal silicon wafers having the general characteristics listed below were used: N-type (phosphorous doped), 0.1–0.5 ohm cm, (100) orientation, 15 mils thick, front surface polished, and back surface etch damaged. The wafers were typically used as received with no additional cleaning. Therefore, the silicon had a $SiO_2$ layer on the surface grown "naturally" at room temperature, generally of the order of below about 30 Angstroms in thickness.

A silicon wafer, with polished side facing upward, was placed on a graphite vacuum chuck. The vacuum capability of the chuck is utilized to firmly secure the silicon wafer to the heating source during the spray deposition discussed hereinafter. The chuck was heated by 3 Ogden (Model No. MW-63) cartridge type heaters embedded in the graphite, and the temperature is controlled by means of a Love (Model 49) temperature controller. The temperature of the graphite vacuum chuck was raised to 450° C. as measured by a thermocouple embedded in the graphite. However, as noted previously there is a temperature differential between the surface temperature of the silicon substrate and the chuck. Maintaining the chuck at 450° C. was found by a surface temperature probe to provide a silicon substrate surface temperature prior to spraying of about 425° C. The spray solution comprised 25 grams of anhydrous indium trichloride dissolved in 25 cc of water to which 125 cc of ethyl acetate and 125 cc of methanol was added. The spray solution was atomized by means of a Binks pneumatic spray nozzle (Model No. 50-175). The distance from the nozzle to the silicon surface was about 28.5 centimeters. Once the temperature of the graphite vacuum chuck had stabilized at 450° C., the atomized $InCl_3$ solution was sprayed onto the heated silicon substrate. The liquid flow rate of the $InCl_3$ spray mixture was measured by a flow meter to be about 10 cc/min.

Throughout each deposition the interference color of the indium oxide layer was monitored to provide a reasonably accurate indication of the thickness of the depositing oxide layer. Upon reaching an indium oxide thickness having an interference color of deep blue, the deposition was terminated and the device quickly removed from the heating source to rapidly lower its temperature. The spray deposition time in this particular example was 70 seconds. The oxide thus formed is strongly adherent and resistive to physical abrasion.

The indium oxide coated wafer was then transferred to a vacuum deposition chamber where standard electron-beam heated evaporation techniques were utilized to deposit an ohmic electrode comprising 1000 Angstroms of titanium followed by 5000 Å of silver to the back surface of the silicon substrate. The coated wafer was then removed from the vacuum chamber and the indium oxide film was placed in intimate contact with a metal evaporation mask with multiple grid patterns. It was then placed back in the vacuum system. And after pumping down to a good vacuum, 10,000 Angstroms of silver was evaporated through the mask onto the indium oxide film. Subsequently after removing from the vacuum chamber, the wafer was cut into individual 1- and 4-cm$^2$ cells of the type shown in the FIGURE.

The efficiency, short-circuit photocurrent density, open circuit photovoltage, and fill factor of a typical cell measured in a simulated AM1 solar spectrum are 11.1%, 28.6 mA/cm$^2$, 0.58 V, and 0.67, respectively.

What is claimed is:

1. A high efficiency indium oxide/n-silicon heterojunction solar cell comprising:
    an n-type silicon substrate having at least one major area surface coated with a thin layer of silicon oxide, $SiO_2$;
    a layer of indium oxide deposited onto said silicon oxide and forming a heterojunction therewith and concurrently forming an anti-reflection layer to said surface;
    ohmic contact means for making electrical connection to said silicon and said indium oxide layers whereupon illumination said solar cell with an equivalent of Air Mass One solar energy, said solar cell exhibits a conversion efficiency in excess of about 10%.

2. The solar cell of claim 1 wherein said silicon substrate has a resistivity ranging from about 0.1 ohm cm to about 1 ohm cm.

3. The solar cell of claim 2 wherein said silicon substrate comprises either single-crystal or polycrystalline silicon.

4. The solar cell of claim 1 wherein said ohmic contact to the indium oxide comprises a grid electrode covering a portion of the major surface area of said oxide.

5. The solar cell of claim 4 wherein said grid electrode comprises titanium and silver.

6. The solar cell of claim 1 wherein said ohmic contact means connected to the silicon comprises titanium and silver.

7. The solar cell of claim 1 wherein the indium oxide layer is of a thickness characterized by an interference color of deep blue.

8. The solar cell of claim 1 wherein said thin layer of silicon oxide, $SiO_2$ is less than about 30 Å.

* * * * *